United States Patent [19]

Ida et al.

[11] Patent Number: 5,727,311
[45] Date of Patent: Mar. 17, 1998

[54] METHOD AND APPARATUS FOR MOUNTING COMPONENT

[75] Inventors: Akiko Ida, Neyagawa; Wataru Hirai, Osaka; Muneyoshi Fujiwara, Katano; Osamu Okuda; Hirokazu Honkawa, both of Hirakata, all of Japan

[73] Assignee: Matsushita Electric Industrial Co., Ltd., Kadoma, Japan

[21] Appl. No.: 587,460

[22] Filed: Jan. 17, 1996

[30] Foreign Application Priority Data

Jan. 17, 1995 [JP] Japan .................... 7-004787

[51] Int. Cl.$^6$ .................................................. H05K 3/30
[52] U.S. Cl. ........................ 29/832; 29/740; 29/759
[58] Field of Search ........................ 29/740, 759, 760, 29/832

[56] References Cited

U.S. PATENT DOCUMENTS

| | | | |
|---|---|---|---|
| 4,619,043 | 10/1986 | Takahashi et al. | 29/740 X |
| 4,999,909 | 3/1991 | Eguchi et al. | 29/740 |
| 5,153,983 | 10/1992 | Oyama | 29/740 |
| 5,193,268 | 3/1993 | Ono et al. | 29/760 K |
| 5,208,969 | 5/1993 | Hidese | 29/740 |
| 5,295,294 | 3/1994 | Ito | 29/740 |
| 5,319,846 | 6/1994 | Takahashi et al. | 29/740 |
| 5,329,692 | 7/1994 | Kashiwagi | 29/740 |
| 5,400,497 | 3/1995 | Watanabe et al. | 29/740 X |
| 5,456,001 | 10/1995 | Mori et al. | 29/740 X |
| 5,495,661 | 3/1996 | Gromer et al. | 29/740 |

FOREIGN PATENT DOCUMENTS

| | | |
|---|---|---|
| 3-206695 | 9/1991 | Japan. |
| 3-238897 | 10/1991 | Japan. |
| 5-167288 | 7/1993 | Japan. |

Primary Examiner—Carl J. Arbes
Attorney, Agent, or Firm—Wenderoth, Lind & Ponack

[57] ABSTRACT

A method for mounting components, includes a first step for feeding to a component feed unit a plurality of stacked-in-stages trays on which components are accommodated, a second step for taking out the components of a Top-stage tray sequentially one by one to mount them onto a board, and a third step for, when the components on the tray are exhausted, removing the empty top-stage tray, and then returning to the second step. An apparatus for mounting Components includes a component feed unit for feeding a plurality of stacked-in-stages trays on which components are accommodated, and a pickup device which can selectively hold either a component pickup nozzle or a tray transfer nozzle. The pickup device is movable between the component feed unit and a specified position of a substrate or between the component feed unit and a tray removal box. A nozzle replacement unit is provided for performing replacement of the pickup nozzle and the tray Transfer nozzle. Also, a control unit is provided for deciding whether or not a component is present on the tray, and controlling the pickup head and the nozzle replacement units in such a manner that, if a component is present, picking up the component by the pickup nozzle and placing it onto the substrate, and if no component is present, replacing the pickup nozzle with the tray transfer nozzle, and picking up the tray and removing it to the tray removal box.

16 Claims, 14 Drawing Sheets

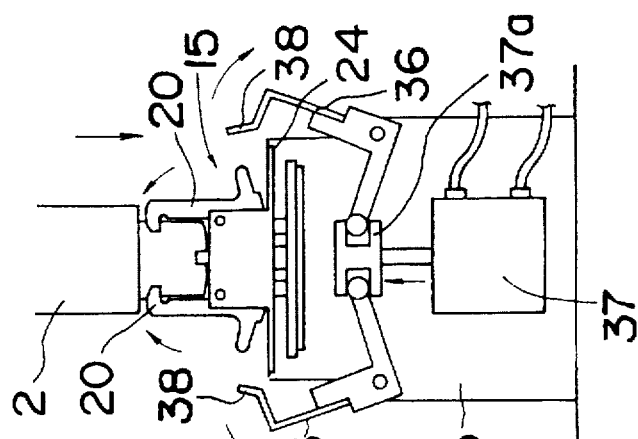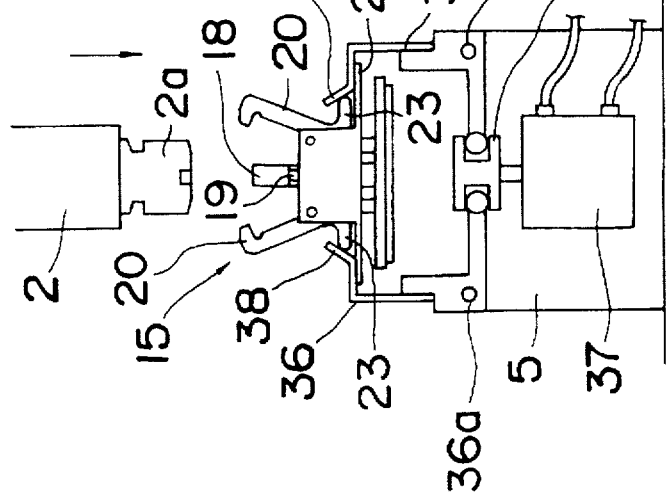

METHOD AND APPARATUS FOR MOUNTING COMPONENT

BACKGROUND OF THE INVENTION

The present invention relates to component mounting method and apparatus for mounting electronic components or other components, which are placed on trays, and onto a board such as a printed circuit board.

FIGS. 7 and 8 show a prior art example of an electronic component mounting apparatus for mounting an electronic component, placed on the trays, onto a printed circuit board.

Referring to FIGS. 7 and 8, each tray 41 is held by a tray plate 42, and the tray plate 42 is accommodated in a tray magazine 43 so as to be arranged into a plurality of stages. The tray magazine 43 is held by a lifter 44 so as to be movable up and down. The tray plates 42 can be drawn out from the tray magazine 43 by a tray plate draw-out device 45 at a specified height position. Electronic components 46 of the tray 41 on the drawn-out tray plate 42 are picked up by suction from a component transfer nozzle 49 of a component transfer head 48 that is movable along a component transfer shaft 47, so that the electronic components 46 are transferred and placed onto a component transfer table 50. To carry out this process, the tray plate draw-out device 45 controls the draw-out position so that a desired electronic component 46 of the tray 41 can be located on the travel path of the component transfer nozzle 49. The electronic component 46 on the component transfer table 50 is sucked for picking up by a pickup nozzle 53. The nozzle is upwardly and downwardly movably mounted on a pickup head 52 which is horizontally movably supported by an X-Y table 51. Then, the sucked electronic component 46 is mounted on a specified position of a printed circuit board 54.

When the electronic components on the tray 41 are exhausted, the tray plate 42 of the tray 41 is returned to the tray magazine 43 by the tray plate draw-out device 45. Then, the lifter 44 is operated so that another tray plate 42 can be drawn out by the tray plate draw-out device 45.

However, with the above-described construction, since only one tray 41 is held by the tray plate 42, only a small number of components can be accommodated in the tray magazine 43 such that component replenishment needs to be performed frequently. Besides, it is necessary to provide each of the trays 41 with an individual tray plate 42. Thus, component replenishment involves much time and labor.

SUMMARY OF THE INVENTION

An object of the present invention is to provide a method and apparatus for mounting components, which can reduce the frequency of component replenishment and which allows components to be replenished in short time and with simplicity.

In accomplishing these and other objects, according to a first aspect of the present invention, there is provided a method for mounting components, comprising:

a first step for feeding to a component feed unit a plurality of stacked-in-stages trays on which components are accommodated;

a second step for taking out the components of a top-stage tray of the trays sequentially one by one to mount them onto a board; and a third step for, when the components on the tray are exhausted and then the tray is empty, removing the empty top-stage tray, and then returning to the second step.

According to a second aspect of the present invention, there is provided a method for mounting components, comprising:

a first step for picking up one of components placed on a tray placed in a component feed unit, with a pickup nozzle, and mounting the picked-up component to a specified position of a board;

a second step for deciding whether or not a component is present on the tray, where if it is decided that a component is present, returning to the first step, and if it is decided that no component is present, going to a third step;

the third step for picking up and holding the tray on which no component is present, and removing the tray, with the pickup nozzle; and a fourth step for returning to the first step after removing the tray on which no component is present.

According to a third aspect of the present invention, there is provided a method for mounting components, comprising:

a first step for picking up one of components placed on a tray placed in a component feed unit, with a pickup nozzle, and mounting the picked-up component to a specified position of a board;

a second step for deciding whether or not a component is present on the tray, where if it is decided that a component is present, returning to the first step, and if it is decided that no component is present, going to a third step;

the third step for removing the pickup nozzle from a pickup head and fitting a tray transfer nozzle thereto;

a fourth step for picking up and holding the tray on which no component is present, and removing the tray, with the tray transfer nozzle; and a fifth step for, after removing the tray on which no component is present, removing the tray transfer nozzle from the pickup head and fitting the pickup nozzle thereto, and returning to the first step.

According to a fourth aspect of the present invention, there is provided an apparatus for mounting components, comprising:

a component feed unit for feeding a plurality of stacked-in-stages trays on which components are accommodated;

a pickup head for holding a pickup nozzle that picks up one of the components on the tray, the pickup head being movable between the component feed unit and a specified position of a board; and a control unit for deciding whether or not a component is present on the tray, and controlling the pickup head in such a manner that, if a component is present, picking up the component by the pickup nozzle and mounting it onto the board, and if no component is present, picking up the tray where no component is present and removing it to a removal position.

According to a fifth aspect of the present invention, there is provided an apparatus for mounting components, comprising:

a component feed unit for feeding a plurality of stacked-in-stages trays on which components are accommodated;

a pickup head which is capable of selectively holding either a pickup nozzle that picks up one of the components on the tray which is movable between the component feed unit and a specified position of a board or a tray transfer nozzle that picks up an empty tray of the trays, and which is movable between the component feed unit and a tray removal position;

a nozzle replacement unit for performing replacement of the pickup nozzle and the tray transfer nozzle; and a control unit for deciding whether or not a component is present on the tray, and controlling the pickup head and the nozzle replacement unit in such a manner that, if a component is present, picking up the component by the pickup nozzle and mounting it onto the board, and if no component is present, replacing the pickup nozzle with the tray transfer nozzle, and picking up the tray where no component is present and removing it to a removal position.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 5A, 5B, and 5C are explanatory views for the construction and operation of the tray transfer nozzle replacement unit in the embodiment; shown in FIG. 1

DETAILED DESCRIPTION OF THE PREFERRED EMBODIMENTS

Figure 1:
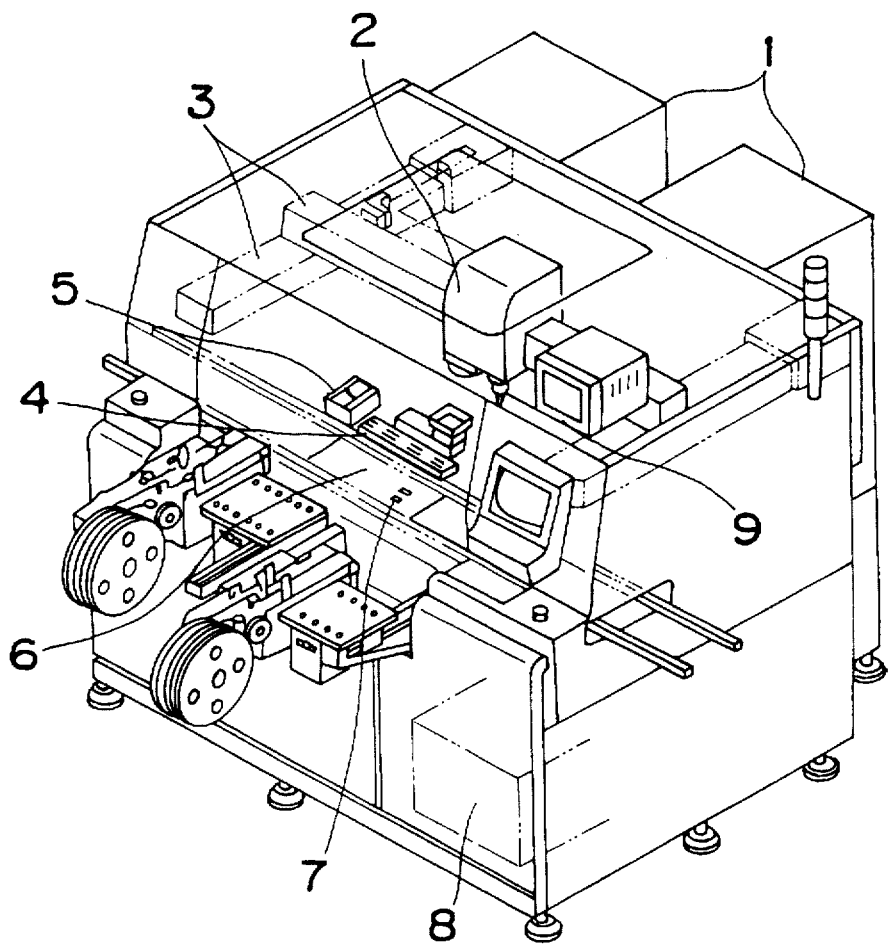
FIG. 1 is a schematic perspective view of an electronic component mounting apparatus according to an embodiment of the present invention.

Before the description of the present invention proceeds, it is to be noted that like parts are designated by like reference numerals throughout the accompanying drawings.

Hereinbelow, an electronic component mounting apparatus according to an embodiment of the present invention is described with reference to FIGS. 1 through 6B, and 9A through 13.

Figure 2:
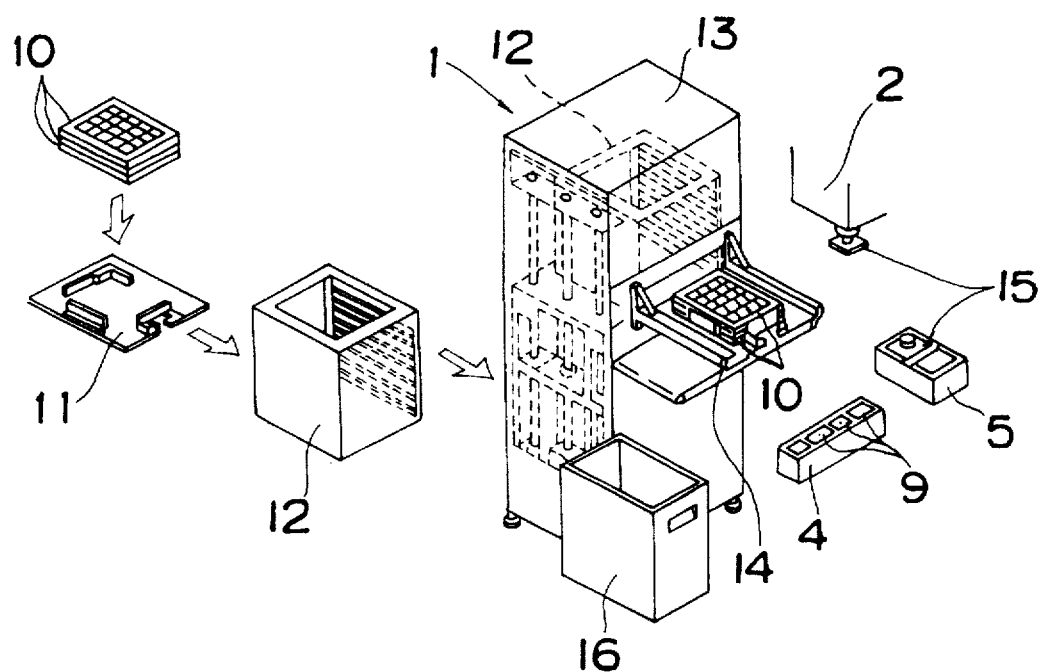
FIG. 2 is a perspective view of a part of the apparatus of the embodiment; shown in FIG. 1
Figure 3A:
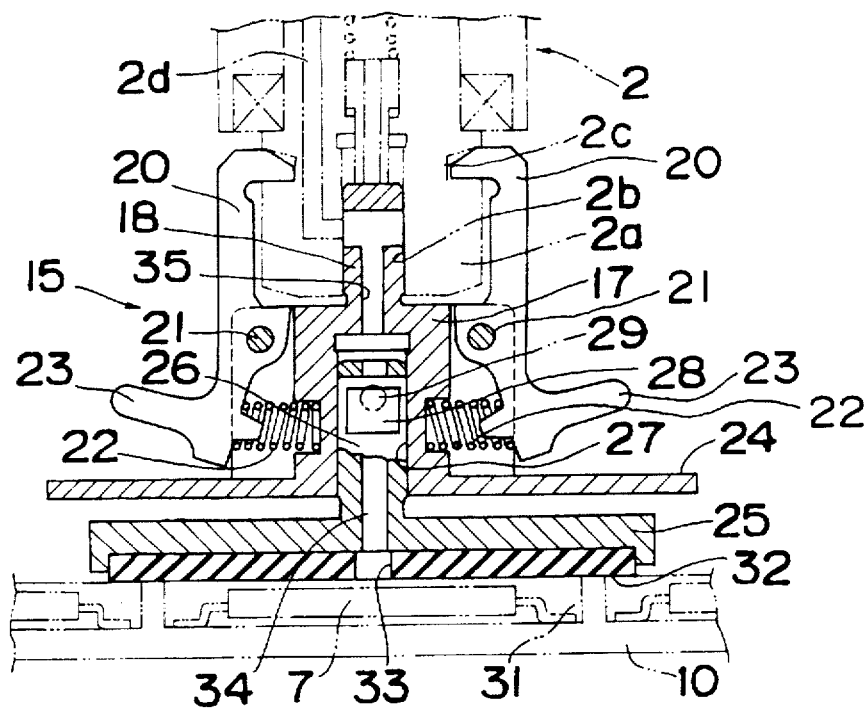
FIG. 3A is a longitudinal sectional view of a tray transfer nozzle of the embodiment; shown in FIG. 1
Figure 10A:
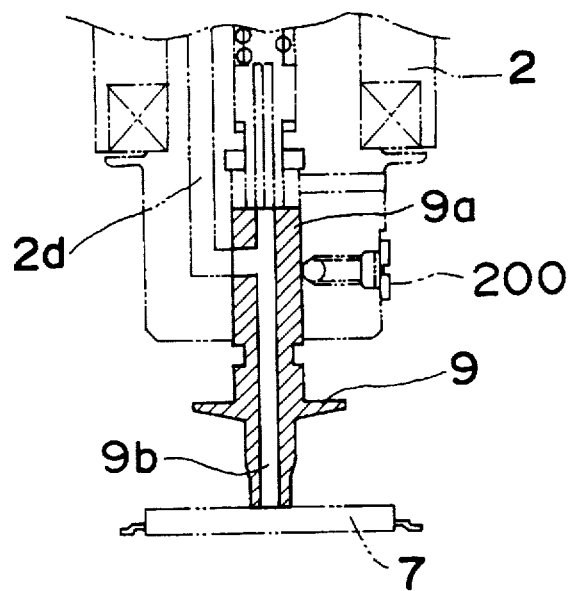
FIG. 10A is a sectional side view showing a state where an electronic component is sucked and picking up by the pickup nozzle.

Referring to FIGS. 1 and 2, reference numeral 1 denotes a component feed unit for feeding a plurality of stacked-in-stages trays 10 to a specified component take-out position. A plurality of electronic components 7 are placed on each of the trays 10. Designated by numeral 2 is a pickup head, which is driven and moved by an X-Y table 3. The pickup head 2 picks up and holds one of the electronic components 7 placed on the tray 10 at the component take-out position of the component feed unit 1 and then mounts it on a specified position of a printed circuit board 6, or the pickup head 2 picks up and holds an empty tray 10 at the component take-out position and then discards it in a tray discard box 16. For this purpose, the pickup head 2 is so constructed as to allow either a pickup nozzle 9 or a tray transfer nozzle 15, whichever it is, to be selectively fitted thereto. That is, for a process of picking up the electronic component 7 on the tray 10 and mounting it on the specified position of the printed circuit board 6, the pickup nozzle 9 is fitted to the pickup head 2 as shown in FIG. 10A. On the other hand, for a process of picking up and holding the tray 10 and then transferring it to a specified discard position, the tray transfer nozzle 15 is fitted to the pickup head 2 as shown in FIG. 3A. Numeral 8 denotes a control unit, which decides whether or not the electronic component 7 is present on the tray 10, followed by control operations as shown below. That is, if the electronic component 7 is present, an operation of mounting the electronic component 7 on the specified position of the printed circuit board 6 with the pickup nozzle 9 is repeated. If no electronic component 7 is present, the empty tray 10 is picked up and held with the tray transfer nozzle 15 fitted to the pickup head 2, and then discarded in the tray discard box 16.

Numeral 4 denotes a pickup nozzle replacement unit, and 5 denotes a tray transfer nozzle replacement unit. The control unit 8 performs a control operation to selectively replace the pickup nozzle 9 with the tray transfer nozzle 15 or vice versa for the pickup head 2. Also, the control unit 8 selects a tray transfer nozzle 15 corresponding to the type of the tray 10 among tray transfer nozzles 15 corresponding to the types of the trays 10 and fits it to the pickup head 2, in the tray transfer nozzle replacement unit 5.

Figure 12:
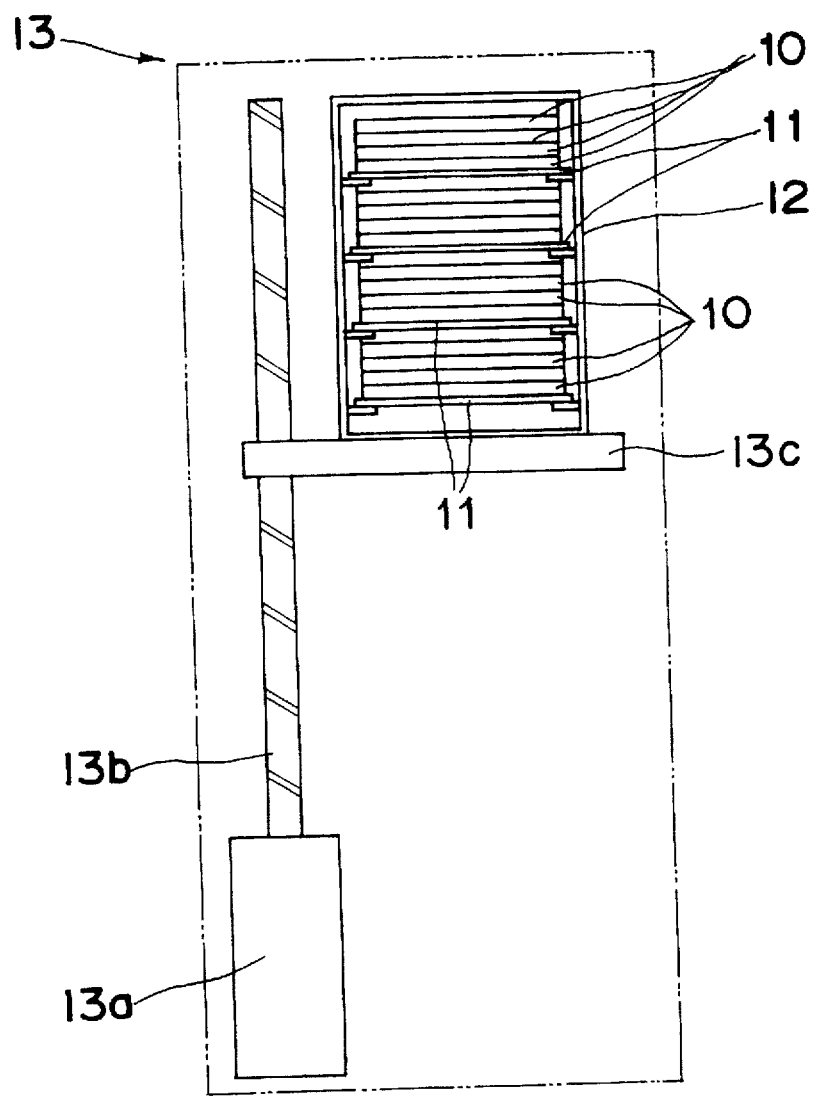
FIG. 12 is an explanatory view showing the construction of a lifter in the embodiment of FIG. 1.
Figure 13:
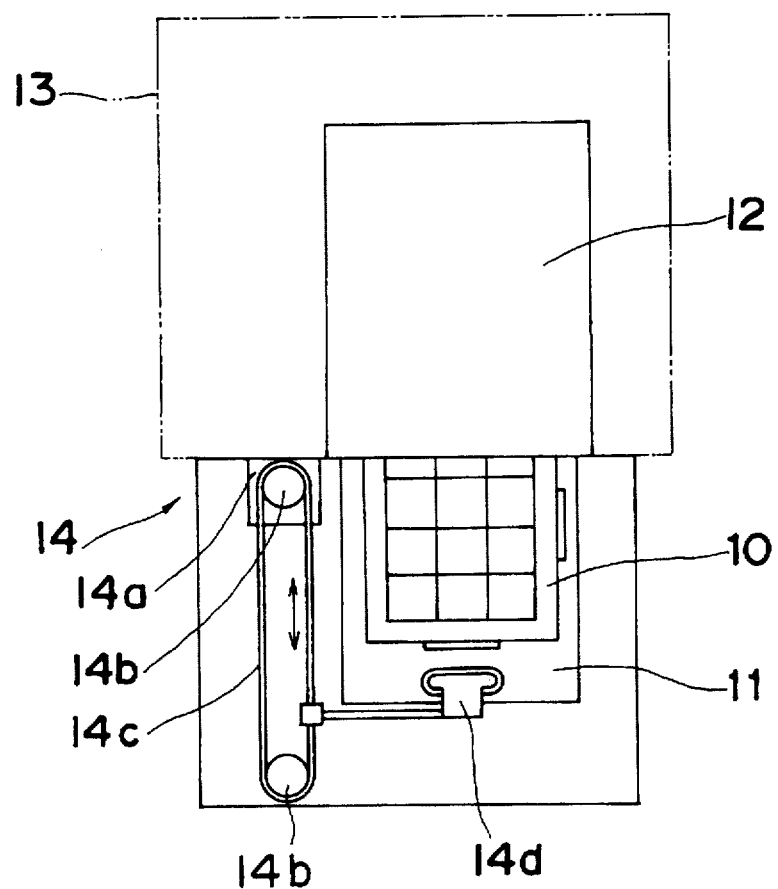
FIG. 13 is a plan view showing the lifter and a tray plate draw-out device in the embodiment of FIG. 1.

Referring to FIG. 2, the component feed unit 1 comprises a tray plate 11 on which the plurality of stacked-in-stages trays 10 having electronic components 7 accommodated thereon can be fixedly set; a tray magazine 12 which can accommodate a plurality of tray plates 11 thereon; a lifter 13 which can move the tray magazine 12 in a vertical direction; and a tray plate draw-out device 14 for taking out a tray plate 11 located at a specified height position, from the lifter 13. The tray plate is moved to a component feed position where one of the components in the uppermost tray 10 on the taken-out tray plate 11 can be picked up by the pickup nozzle 9. As shown in FIG. 12, the lifter 13 has a motor 13a, a ball screw shaft 13b rotated by the motor 13a, and a support plate 13c movable along the ball screw shaft 13b by driving the motor 12a. The tray magazine 12 is placed on the support plate 13c. As shown in FIG. 13, the tray plate draw-out device 14 has a motor 14a, pulleys 14b one of which is driven by the motor 14a, a belt 14c connected between the pulleys 14b, and a connection portion 14d for connecting to the taken-out tray plate 11. Thus, the motor 14a is reversibly driven to rotate the pulleys 14b via the belt 14c to move the connection portion 14d together with the taken-out tray plate 11 between a taken-out position shown in FIG. 13 and a position in the tray magazine 12.

Figure 3B:
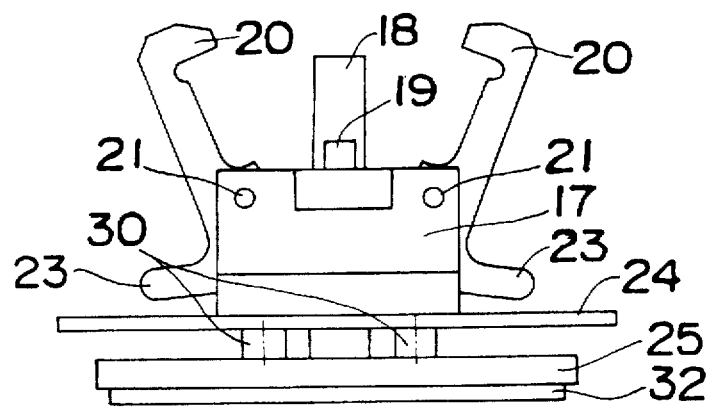
FIG. 3B is a front view of the tray transfer nozzle of the embodiment; shown in FIG. 1
Figure 3C:
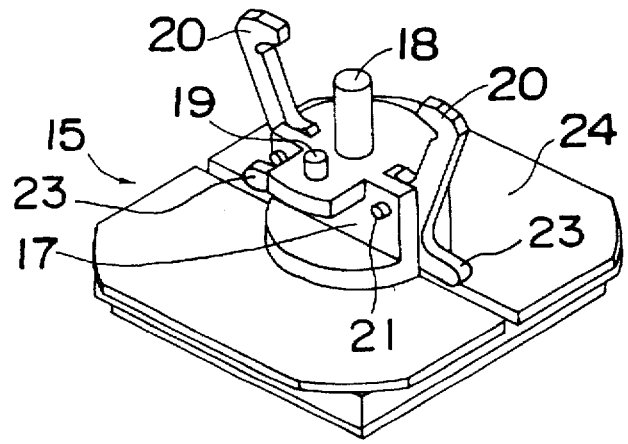
FIG. 3C is a perspective view of the tray transfer nozzle of the embodiment; shown in FIG. 1

FIGS. 3A, 3B, and 3C show the details of the tray transfer nozzle 15. Referring to FIGS. 3A, 3B, and 3C, the tray transfer nozzle 15 comprises a fitting shaft 18 which can be inserted into a fitting hole 2b formed at an axial center portion of a lower end shaft 2a of the pickup head 2, a positioning pin 19 for positioning in the rotational direction, the fitting shaft 18 and the positioning pin 19 being formed at the top end portion of a nozzle body 17 so as to be protruded from the top end, and further opening/closing claws 20 which can be engaged with engagement recesses 2c, respectively, formed on both sides of the end shaft 2a on both sides of the nozzle body 17. The opening/closing claws 20 are each pivotally held by a pivot pin 21 so as to be swingable between an engagement position and an engagement-release position, and further normally biased by a spring 22 toward the engagement position. Moreover, the opening/closing claws 20 each have an engagement-release protrusion 23.

At the lower end of the nozzle body 17, a support plate 24 is integrally provided, and a pickup plate 25 is fitted below the support plate 24 with an appropriate spacing in such a way that the pickup plate 25 can be moved so as to approach the support plate 24. More specifically, a pickup shaft 26 provided so as to protrude upward from the center portion of the pickup plate 25 is upwardly and downwardly movably fitted into a fitting hole 27 formed at the center portion of the nozzle body 17. Besides, a lock screw 29 screwed so as to radially pass through the nozzle body 17 from its outer surface is fitted to a flat portion 28 formed on the outer surface of the pickup shaft 26, whereby the pickup shaft 26 is prevented from coming off from the nozzle body 17. Moreover, springs 30 are interposed between the support plate 24 and the pickup plate 25 so that the pickup plate 25 is protrudingly biased so as to be advanceable and retractable. Below the pickup plate 25, a close-contact plate 32 formed of an elastic material having a flat area at least larger than one component-accommodating recessed portion 31 of the tray 10 is provided, and a pickup hole 33 is formed at a center portion of the close-contact plate 32. This pickup hole 33 is arranged to communicate with a suction hole 2d formed at the lower end shaft 2a of the pickup head 2, via a suction hole 34 bored through the pickup plate 25 and the center position of its pickup shaft 26, the fitting hole 27 of the nozzle body 17, and a suction hole 35 formed at the center portion of the fitting shaft 18 so as to communicate with the fitting hole 27.

Figure 9A:
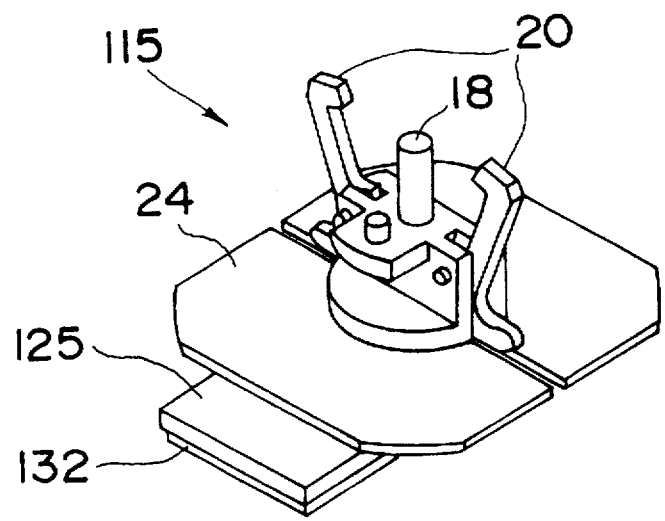
FIGS. 9A and 9B are perspective views showing different types of tray transfer nozzles.
Figure 9B:
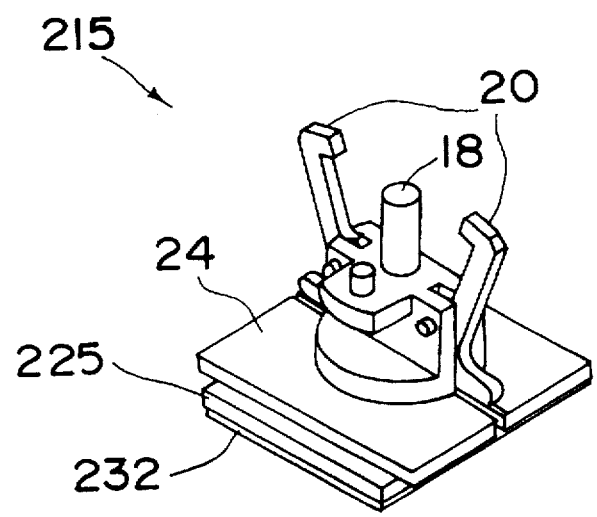

FIGS. 9A and 9B show different types of tray transfer nozzles 115, 215 which can be accommodated in the tray transfer nozzle replacement unit 5 in addition to the tray transfer nozzle 15. As shown in FIG. 9A, the tray transfer nozzle 115 has a rectangular pickup plate 125 and a close-contact plate 132 corresponding to the pickup plate 25 and the close-contact plate 23 so as to pick up an empty tray 10 by sucking a rectangular component-accommodating recessed portion of the tray 10 with the pickup nozzle 25 while the close-contact plate 132 is brought into close contact with the top surface of the empty tray 10. As shown in FIG. 9B, the tray transfer nozzle 215 has a large square pickup plate 225 and a close-contact plate 232 corresponding to the pickup plate 25 and the close-contact plate 23 so as to pick up an empty tray 10 by sucking a large square component-accommodating recessed portion of the tray 10 with the pickup nozzle 25 while the close-contact plate 232 is brought into close contact with the top surface of the empty tray 10. The large square of the pickup plate 225 is larger than the pickup plate 25.

As shown in FIG. 10A where the pickup nozzle 9 sucks and picks up the component 7, the pickup nozzle 9 includes a holding portion 9a through which a pickup hole 9b is arranged to communicate with a suction hole 2d formed at the lower end shaft 2a of the pickup head 2. The holding portion 9a can be removably inserted into the fitting hole 2b of the pickup head 2. A ball portion at an inner end of a lock screw 200 screwed so as to radially pass through the pickup nozzle 2 from its outer surface is removably engaged with the outer surface of the holding portion 9a, such that the pickup nozzle 9 is prevented from coming off from the pickup nozzle 2.

Figure 4C:
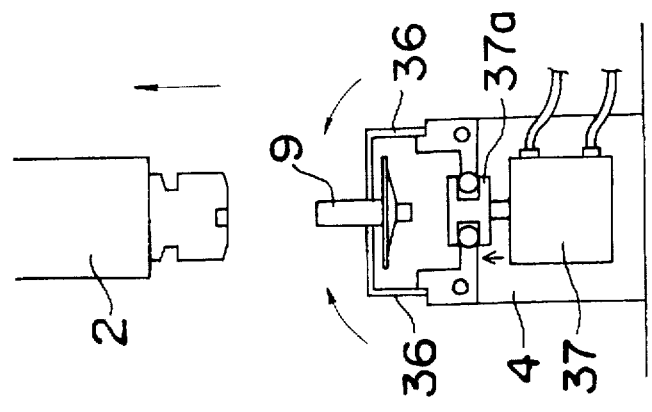
FIGS. 4A, 4B, and 4C are explanatory views for the construction and operation of the pickup nozzle replacement unit in the embodiment; shown in FIG. 1
Figure 4B:
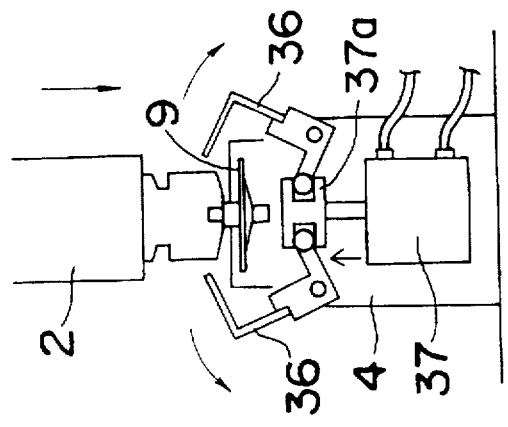
Figure 4A:
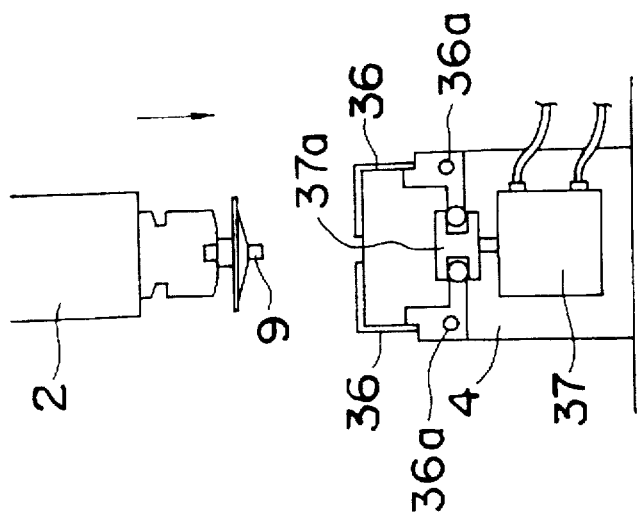

FIGS. 4A, 4B, and 4C show the construction and replacement operation of the pickup nozzle replacement unit 4. FIGS. 5A, 5B, and 5C show the construction and replacement operation of the tray transfer nozzle replacement unit 5. In the pickup nozzle replacement unit 4, a pair of engaging members 36 arranged so as to be an inverted-L shaped and opposed to each other are openable, closable, and swingable, the engaging members 36 can be driven to be opened or closed by an air cylinder 37. That is, a piston rod 37a of the air cylinder 37 is moved upwardly to rotate the engaging members 36 around their shafts 36a so as to be moved away from each other, and thus the engaging members 36 are opened as shown in FIG. 4B. The piston rod 37a of the air cylinder 37 is moved downwardly to rotate the engaging members 36 around their shafts 36a so as to be moved close to each other, and thus the engaging members 36 are closed as shown in FIG. 4C. The tray transfer nozzle replacement unit 5 is constructed in the same way as the pickup nozzle replacement unit 4 in principle, except for the size. Referring to their difference, an operation portion 38 is provided on each of the engaging members 36 The operation positions engage with the engagement-release protrusions 23 of the opening/closing claws 20 to make the opening/closing claws 20 open. The tray transfer nozzle 15 is held by the engaging members 36.

When the pickup nozzle 9 is removed from the pickup head 2 and then the tray transfer nozzle 15 fitted thereto, the pickup head 2 is lowered while the pickup head 2 is kept just above the pickup nozzle replacement unit 4 as shown in FIG. 4A. Subsequently, the engaging members 36 are opened by the air cylinder 37 as shown in FIG. 4B, so that the pickup nozzle 9 is held by the pickup nozzle replacement unit 4. Thereafter, as shown in FIG. 4C, the engaging members 36 are closed by the air cylinder 37 and the pickup head 2 is elevated, whereby the pickup nozzle 9 is removed from the pickup head 2. Then, as shown in FIG. 5A, the pickup head 2 is lowered while the pickup head 2 is above one of the tray transfer nozzles 15 in the tray transfer nozzle replacement unit 5. Subsequently, as shown in FIG. 5B, the tray transfer nozzle 15 is fitted to the lower end shaft 2a of the pickup head 2, and the engaging members 36 are opened by the air cylinder 37 to release the engagement of the operation portions 38 of the engaging members 36 with the engagement-release protrusions 23 of the opening/closing claws 20, whereby the opening/closing claws 20 are closed so as to be engaged with the lower end shaft 2a. Then, as shown in FIG. 5C, the pickup head 2 is elevated. Thus, the replacement of the pickup nozzle 9 with the tray transfer nozzle 15 for the lower end shaft 2a of the pickup head 2 is completed.

Figure 11:
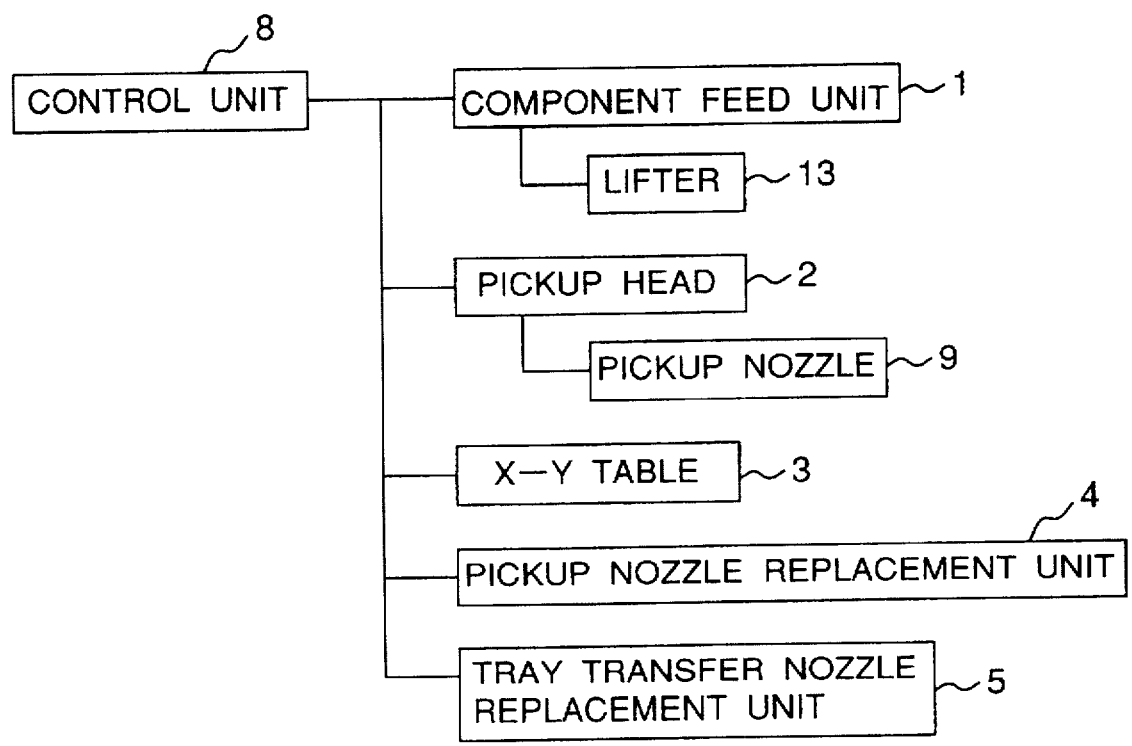
FIG. 11 is a block diagram showing the connection between a control unit and the other devices.

As shown in FIG. 11, the control unit 8 is connected with the component feed unit 1, the lifter 13, the pickup head 2, the pickup nozzle 9, the X-Y table 3, the pickup nozzle replacement unit 4, and the tray transfer nozzle replacement unit 5 to control their operations.

Additionally, the trays 10 discarded in the tray discard box 16 may be replenished with new components and reused as new trays 10

Figure 6A:
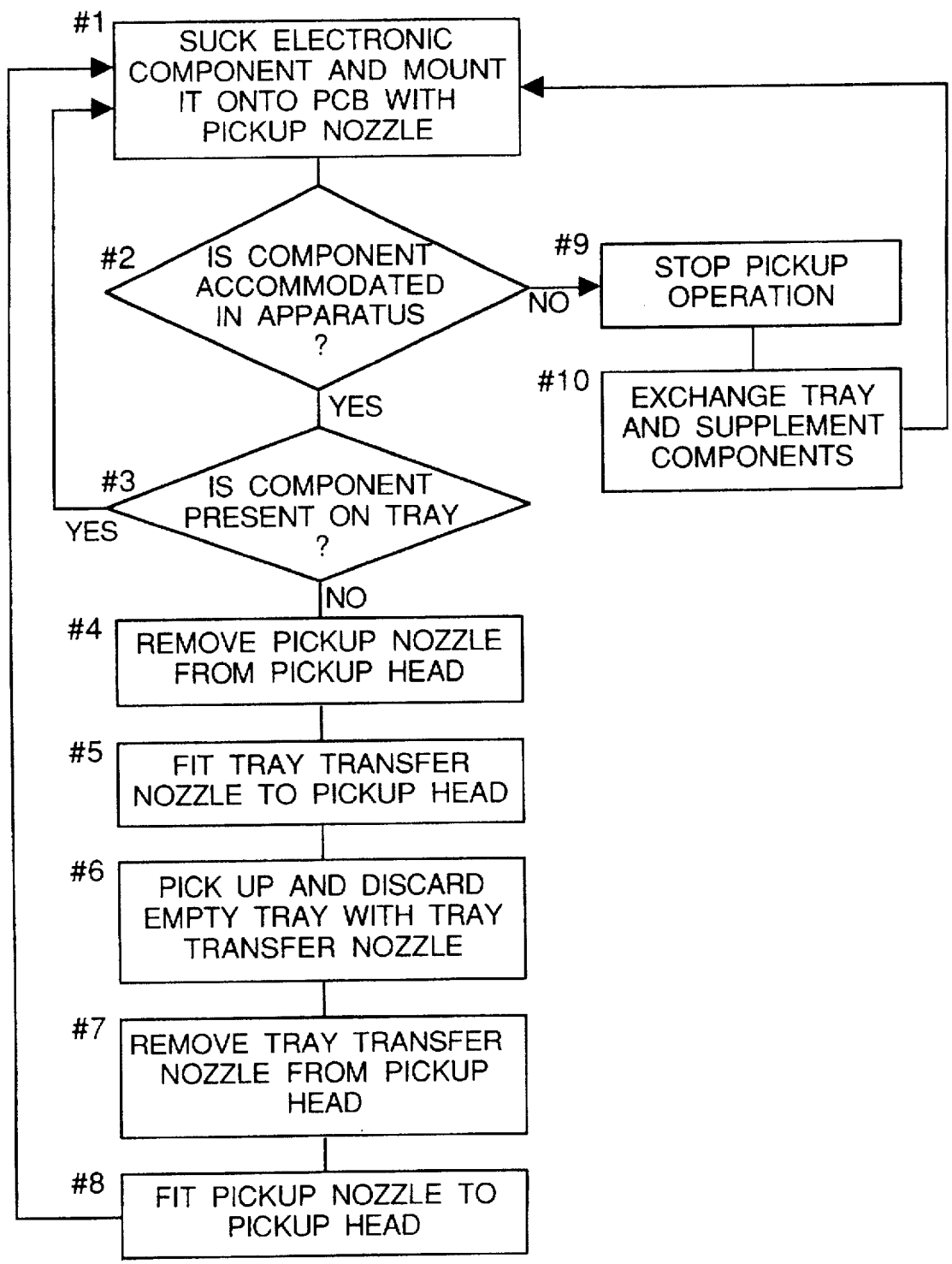
FIG. 6A is a flowchart for the component mounting operation in the embodiment; shown in FIG. 1

Next, the operation of the electronic component mounting apparatus having the above construction is described with reference to the flowchart of FIG. 6A.

First, the pickup head 2 is moved by the X-Y table 3 to a position above an electronic component 7 on the tray 10. The pickup nozzle 9 lowers so as to pick up and hold the electronic component 7 by suction, and then the pickup head elevates. The pickup nozzle 9 is then moved by the X-Y table 3 to a position above the printed circuit board 6, where the pickup nozzle 9 mounts the electronic component 7 on a specified position of the board 6 (Step #1).

Next, before performing Step #2, the configuration of the tray 10, the number of the trays 10, and the number of the electronic components 7 in each tray 10 are previously stored in the control unit 8. Then, at Step #2, the control unit 8 counts the number of the components 7 which have been used and compares the counted number with the stored number of the components 7, so that the control unit 8 decides whether or not the electronic component 7 in the apparatus is present. If the electronic component 7 is present in the apparatus, the program flow goes to Step #3. If no electronic component 7 is present in the apparatus, the program flow goes to Step #9. At Step #9, the pickup operation of the apparatus is stopped and at Step #10, the trays 10 are exchanged with new trays 10 by driving the component feed unit 1 to supply the components 7.

At Step #3, the control unit 8 counts the number of the components 7 which have been used in the tray 10 and compares the counted number with the stored number of the components 7, so that the control unit 8 decides whether or not the electronic component 7 is present on the tray 10. If the electronic component 7 is present on the tray 10, the program flow returns to Step #1. If no electronic component 7 is present on the tray 10, the program flow goes to Step #4.

At Step #4, the pickup head 2 is moved by the X-Y table 3 to a position above the pickup nozzle replacement unit 4. As shown in FIGS. 4A, 4B, and 4C, the pickup nozzle 9 lowers to the specified position in the pickup nozzle replacement unit 4, where the pickup nozzle 9 is removed from the pickup head 2.

Next, the pickup head 2 moves to a position just above one of the tray transfer nozzles 15 and then lowers to a specified height position so that the fitting shaft 18 and 10 the positioning pin 19 of the tray transfer nozzle 15 may be inserted into the lower end shaft 2a of the pickup head 2 as shown in FIG. 5A. The engaging members 36, which have been holding the opening/closing claws 20 open, are opened by the air cylinder 37 as shown in FIG. 5B, whereby the opening/closing claws 20 are closed by the urging forces of the springs 22. Then, the tray transfer nozzle 15 is fitted to the lower end shaft 2a of the pickup head 2 and elevated as shown in FIG. 5C (Step #5).

Next, the pickup head 2 having the tray transfer nozzle 15 is moved by the X-Y table 3 to just above the tray 10. The tray transfer nozzle 15 lowers so that the close-contact plate 32 located below the pickup plate 25 of the tray transfer nozzle 15 is brought into close contact with the top surface of the empty tray 10, where the tray 10 is picked up by suction and held by the tray transfer nozzle 15. In this operation, even if the tray 10 has a distortion or the like, the close-contact plate 32 can be elastically deformed so as to make close contact with the tray 10. Besides, since the close-contact plate 32 has a flat area at least larger than one component-accommodating recessed portion 31 and moreover has the pickup hole 33 formed at its center portion, the tray 10 can be securely picked up by suction. Furthermore, since the tray transfer nozzle 15 is engaged with the lower end shaft 2a of the pickup head 2 by the opening/closing claws 20, the tray 10 will never fall off during transfer even though the tray 10 is heavy in weight relative to an electronic component 7. Then, the pickup head 2 is moved by the X-Y table 3 to above the tray discard box 16, and thereafter released from the pickup by the tray transfer nozzle 15, so that the empty tray 10 is discarded in the tray discard box 16 (Step #6).

Next, the pickup head 2 is moved by the X-Y table 3 again to a position above the tray transfer nozzle replacement unit 5. The tray transfer nozzle 15 at the lower end of the pickup head 2 is lowered so as to be accommodated and held at a specified position in the tray transfer nozzle replacement unit 5. In this operation, simultaneously when the tray transfer nozzle 15 is lowered, the tray transfer nozzle replacement unit 5 has the engaging members 36 in an open position by the air cylinder 37 in accordance with the upper movement of the piston rod 37a of the air cylinder 37. Then, the tray transfer nozzle 15 is held at the specified position, and thereafter the engaging members 36 are closed by the air cylinder 37 in accordance with the lower movement of the piston rod 37a of the air cylinder 37, whereby the opening/closing claws 20 are opened by the engagement of the operation portions 38 of the engaging members 36 with the engagement-release protrusions 23 of the opening/closing claws 20. Thus, the tray transfer nozzle 15 is removed from the pickup head 2, and the pickup head 2 again elevates (Step #7).

Next, the pickup head 2 is moved by the X-Y table 3 to a position above the pickup nozzle replacement unit 4, and then lowers. The pickup head 2 has a necessary pickup nozzle 9 fitted thereto, and then elevates (Step #8). Thereafter, the program flow returns to Step #1, where the process of picking up and mounting the electronic component 7 is carried out. From this point on, the above processes are repeated.

Figure 6B:
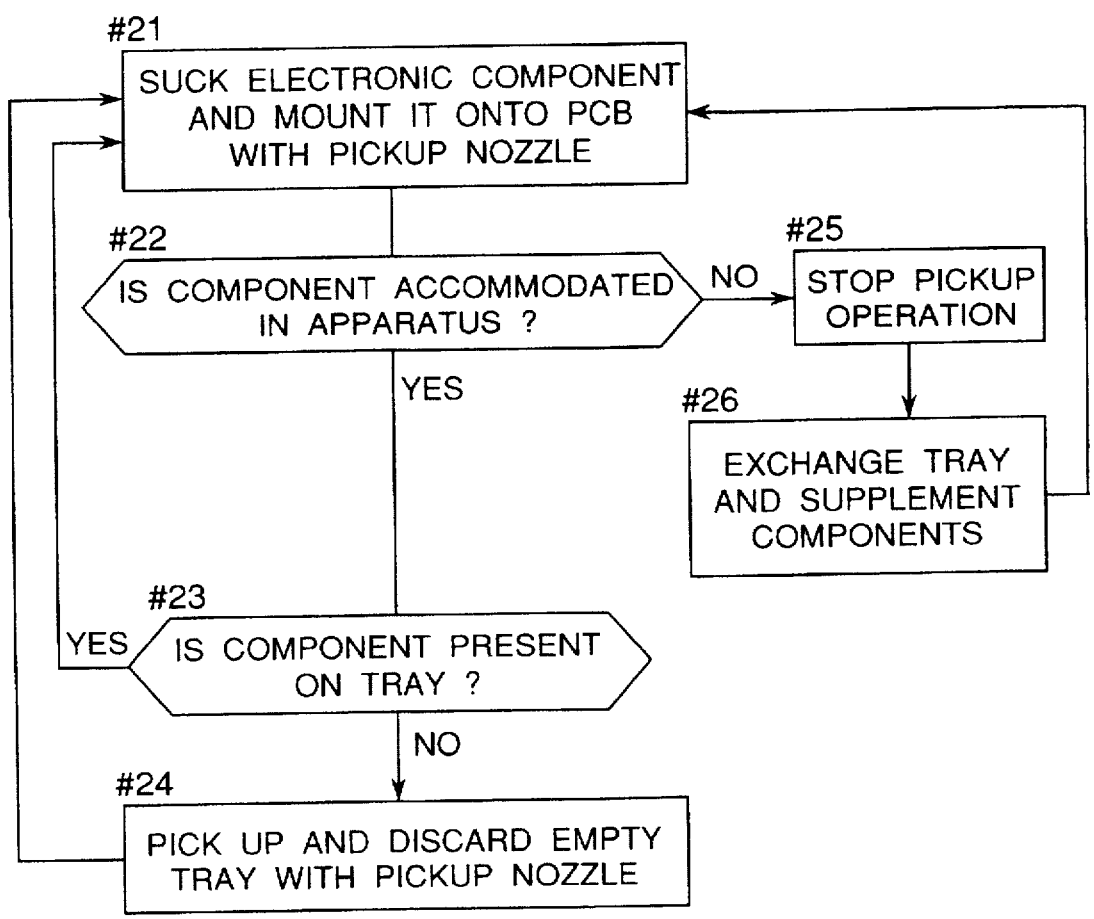
FIG. 6B is a flowchart for the component mounting operation in another embodiment of the present invention.
Figure 7:
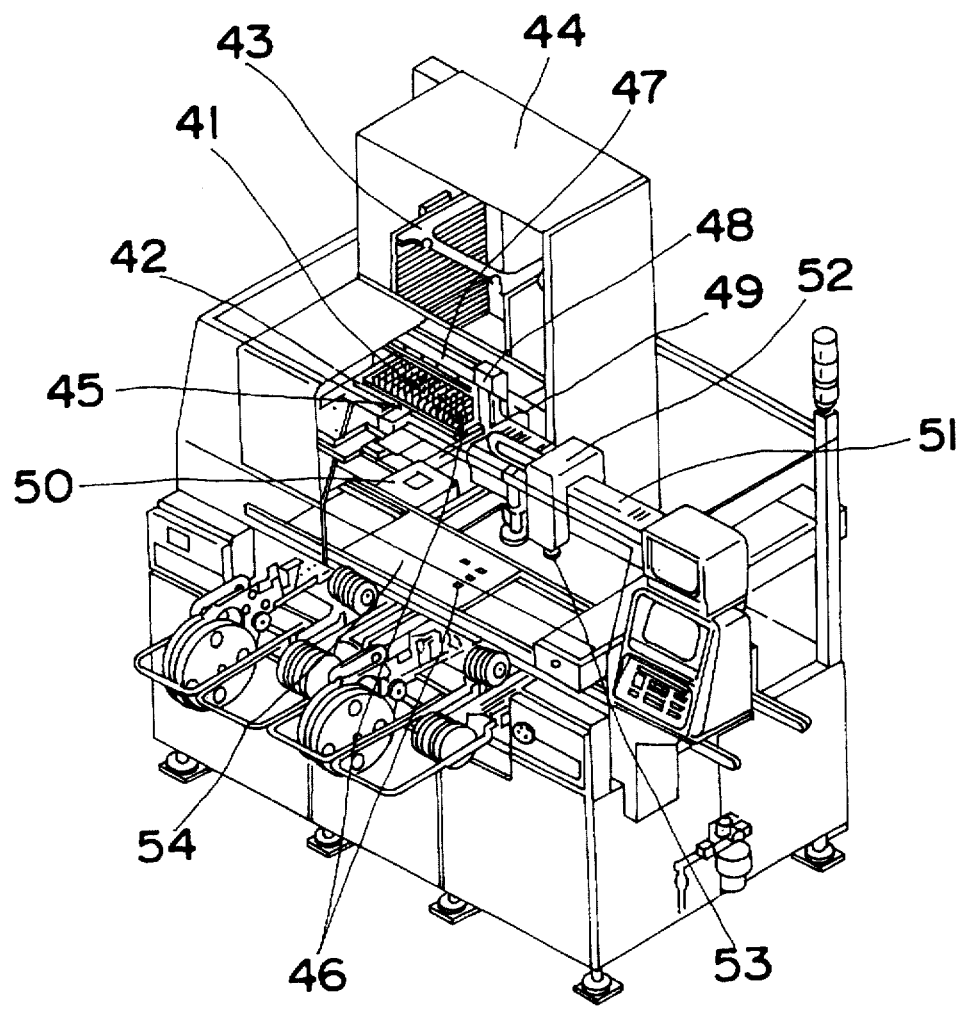
FIG. 7 is a schematic perspective view of a prior art electronic component mounting apparatus.
Figure 8:
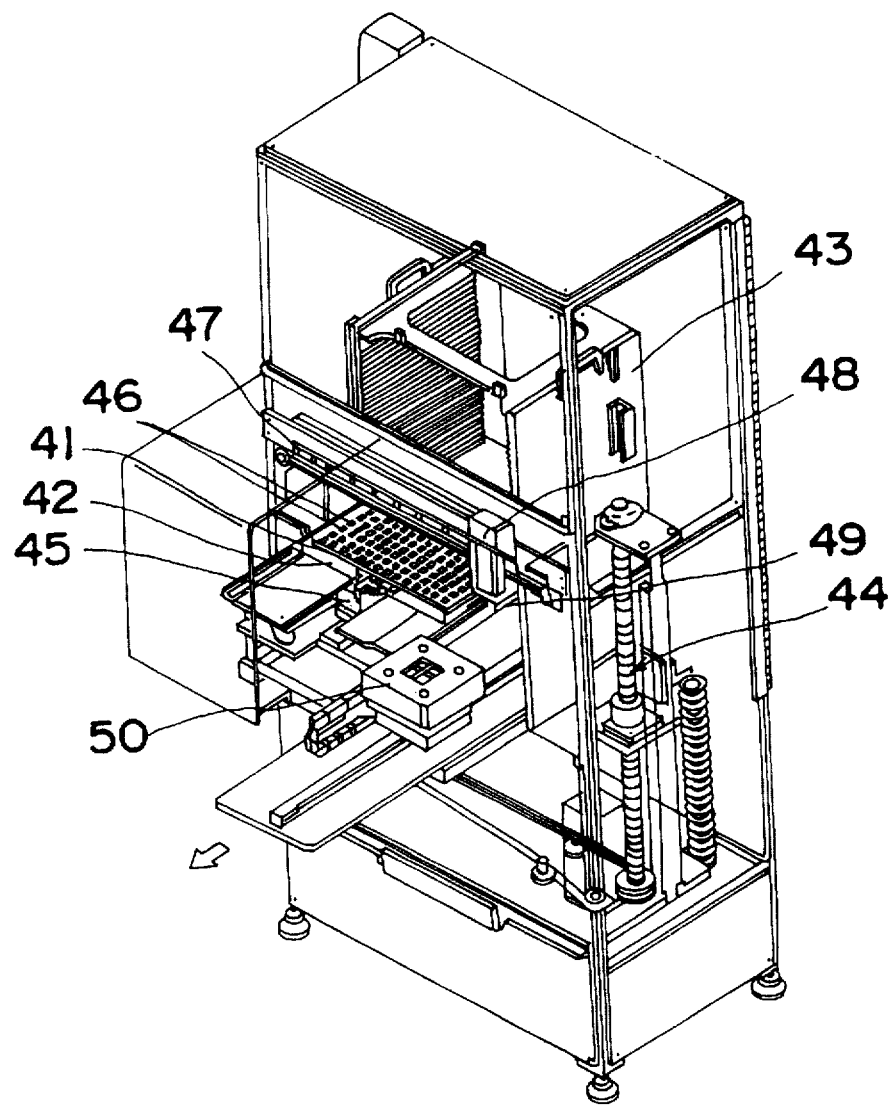
FIG. 8 is a perspective view of the prior art component feed unit shown in FIG. 7.
Figure 10B:
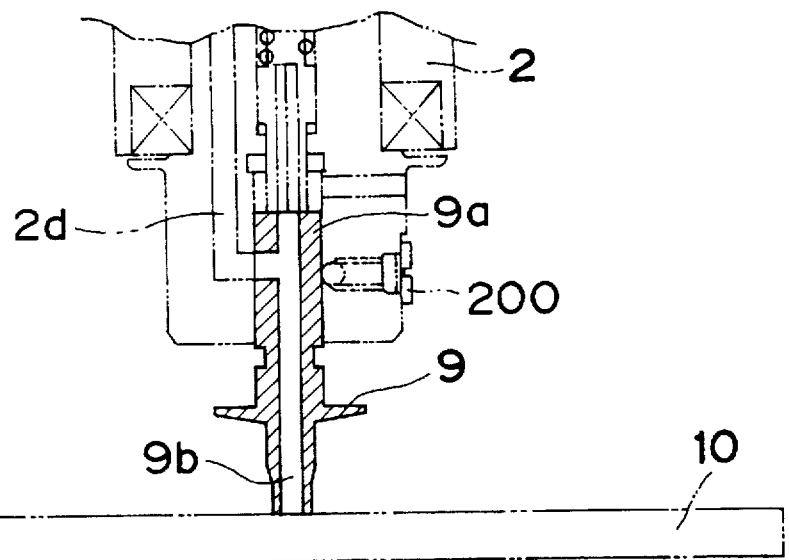
FIG. 10B is a sectional side view showing a state where an empty tray is sucked and picking up by the pickup nozzle in another embodiment.

According to another embodiment of the present invention, the pickup nozzle 9 can suck the component 7 and the tray 10 without using the tray transfer nozzle 15 as shown in FIGS. 10A and 10B. That is, as shown in FIG. 6B, at Steps #21, #22, and #23, the same operations at Steps #1, #2, and #3 of FIG. 6A are performed. At step #24, although the pickup nozzle 9 is removed from the pickup head 2 to replace it with the tray transfer nozzle 15, the empty tray 10 is sucked by the pickup nozzle 9 as shown in FIG. 10B without replacing with the pickup nozzle 9 the tray transfer nozzle 15. Then, the program flow is returned to Step #21 after Step #24. The other Steps #25 and #26 are the same as Steps #9 and #10.

Although the empty tray 10 is discarded in the embodiments, the empty tray 10 may be simply moved to a removal position arranged in a similar position to the tray discard position so as to be removed from an operating path of the pickup operation without discarding it.

According to the method for mounting components of the embodiment of the present invention, as apparent from the above description, since the plurality of stacked-in-stages trays are fed to the component feed unit, the quantity of components feed per fill to the component feed unit can be increased so that the frequency of component replenishment can be reduced. Besides, when the top-stage tray of the stage stack becomes empty, the empty tray can simply be treated by removing or discarding it, so that the component mounting operation can be continued.

According to the method for mounting components of the embodiment of the present invention, when the components on the tray are exhausted, the empty tray is removed or discarded by using the pickup nozzle. Alternatively, the pickup nozzle of the pickup head is replaced with the tray transfer nozzle, and then the empty tray is removed or discarded by using the tray transfer nozzle of the pickup head. Therefore, the tray removal or discard can be carried out without providing any special tray removal device or tray discard device.

Also, in the embodiment of the present invention, the frequency of component replenishment can be reduced by feeding stacked-in-stages trays to the component feed unit. Also, using a tray transfer nozzle suited to the type of the tray allows various types of trays to be available.

According to the apparatus for mounting components of the embodiment of the present invention, since the plurality of stacked-in-stages trays are fed to the component feed unit, the frequency of component replenishment can be reduced. Besides, when the top-stage tray of the stage stack becomes empty, the tray can be removed or discarded by the pickup nozzle of the pickup head. Alternatively, the pickup nozzle of the pickup head can be replaced with the tray transfer nozzle so that the tray can be removed or discarded by the tray transfer nozzle of the pickup head. Therefore, the empty tray can be simply treated without providing any special tray removal device or tray discard device, so that the component mounting operation can be continued.

Also in the embodiment, if the tray plate holding the plurality of stacked-in-stages trays is taken out from the lifter by the tray plate draw-out device at the specified height position, the stacked-in-stages trays can be fed in the component feed unit. Thus, component feed can be quickly accomplished.

Further, if the plurality of tray transfer nozzles are provided, it becomes possible to use any number of different tray types. Also, with the control unit, if the tray transfer nozzle corresponding to the type of the tray is selected, and sucked and held by the pickup head, any arbitrary types of trays can be automatically appropriately removed or discarded.

Further, by using the tray transfer nozzle which has close-contact plate formed of the elastic material having a flat area at least larger than that of one component-accommodating recessed portion of the tray and which has the pickup hole formed in the center portion of the close-contact plate, the tray can be securely picked up and removed or discarded. Also, if the fitting shaft is inserted into the fitting hole of the end portion of the pickup head and the opening/closing claw is engaged therewith, and further the positioning in the rotational direction is fulfilled by the positioning pin, then the tray transfer nozzle can be held at the end portion of the pickup head securely in correct position, and besides, the tray can be securely sucked and picked up and removed or discarded even if the tray is heavy in weight relative to the components. Furthermore, if there are provided a first member that can be brought into close contact with the top surface of the tray, and a second member that holds the first member with an appropriate spacing in such a manner that the first member can be moved so as to elastically approach the top surface of the tray, then the tray can be securely picked up regardless of variations of the thickness of the tray.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of mounting components, comprising:

picking up a component with a pickup nozzle from a first tray positioned in a component feed unit;

mounting the component on a specified position of a board; and determining whether or not a further component is present on the first tray, and if a further component is present on the first tray, then picking up the further component with the pickup nozzle and mounting the further component, or if it is determined that a further component is not present on the first tray, then picking up, holding, and removing the tray with the pickup nozzle, and returning to the component feed unit to pickup a component from a second tray with the pickup nozzle.

2. A method of mounting components, comprising:

picking up a component placed on a first tray, which is located in a component feed unit, wherein said component is picked up with a pickup nozzle fitted to a pickup head;

mounting said picked up component on a board in a predetermined position of said board; and determining whether or not a further component is present on said first tray, wherein if it is determined that a further component is present on said first tray, then picking up and mounting said further component, or if it is determined that a further component is not present on said first tray, then removing said pickup nozzle from said pickup head and fitting a tray transfer nozzle to said pickup head, picking up, holding, and moving said first tray with said tray transfer nozzle, removing said tray transfer nozzle from said pickup head after removing said first tray, fitting said pickup nozzle to said pickup head, and returning said pickup head to said component feed unit.

3. The method of mounting components as claimed in claim 2, wherein said tray transfer nozzle is selected from a plurality of tray transfer nozzles according to the type of tray to be picked up.

4. The method of mounting components as claimed in claim 2, wherein said component feed device holds a plurality of trays stacked in stages.

5. The method of mounting components as claimed in claim 4, wherein said tray transfer nozzle is selected from a plurality of tray transfer nozzles according to the type of tray to be picked up.

6. A component mounting apparatus for mounting components on a board, said apparatus comprising:

a component feed unit for feeding a plurality of stacked stages of trays on which components are accommodated to a component take out position;

a pickup head disposed adjacent said component feed unit and being movable between said component feed unit and the board;

a pickup nozzle connected to said pickup head for picking up a component from one of the trays; and a control unit for determining whether or not a component is present on one of the trays, said control unit being operably connected to said component feed unit and said pickup head such that when said control unit identifies an empty tray, said control unit controls said pickup head so that said pickup head removes the empty tray with said pickup nozzle.

7. The component mounting apparatus as claimed in claim 6, wherein said component feed unit further comprises:

a lifter having a support plate for supporting a plurality of tray plates, wherein each stage of the plurality of stacked tray stages is supported on one of the plurality of tray plates, said support plate being moveable upwardly and downwardly relative to said component take out position so as to locate a specified tray plate adjacent said component take out position; and a tray plate draw-out device disposed adjacent said component take out position and connectable to said specified tray plate for moving said specified tray plate to said component take out position and returning said specified tray plate to a position within said component feed unit.

8. A component mounting apparatus for mounting components on a board, said apparatus comprising:

a component feed unit for holding plurality of stacked-in-stages trays having components accommodated thereon and feeding the trays to a component take out position;

a pickup head disposed adjacent said component feed unit and being movable between said component feed unit and the board;

a pickup nozzle, detachably connected to said pickup head, for picking up components accommodated on the trays;

a nozzle replacement unit disposed adjacent said pickup head and having at least one tray transfer nozzle, said nozzle replacement unit being adapted to replace said pickup nozzle With a tray transfer nozzle, wherein said pickup head is moveable between said component feed unit and said nozzle replacement unit; and a control unit for determining whether or not a component is present on one of said plurality of trays, said control unit being operably connected to said component feed unit, said pickup head, and said nozzle replacement unit.

9. The component mounting apparatus as claimed in claim 8, wherein said component feed unit further comprises:

a lifter having a support plate for supporting a plurality of tray plates, wherein each stage of the plurality of stacked tray stages is supported on one of the plurality of tray plates, said support plate being moveable upwardly and downwardly relative to said component take out position so as to locate a specified tray plate adjacent said component take out position; and a tray plate draw-out device disposed adjacent said component take out position and connectable to said specified tray plate for moving said specified tray plate to said component take out position and returning said specified tray plate to a position within said component feed unit.

10. The component mounting apparatus as claimed in claim 8, wherein said nozzle replacement unit comprises a plurality of tray transfer nozzles corresponding to different types of trays, and said control unit selects one of said plurality of tray transfer nozzles to be coupled to said pickup head in view of the particular type of tray to be picked up.

11. The component mounting apparatus as claimed in claim 8, wherein said tray transfer nozzle comprises a nozzle body connected to a close-contact plate formed of an elastic material, and said close-contact plate defines a suction hole located in a central portion of said close-contact plate, and a flat area which is larger than a component accommodating recess formed in a corresponding tray.

12. The component mounting apparatus as claimed in claim 11, wherein said tray transfer nozzle further comprises:

a first member supporting said close-contact plate and having an upwardly extending shaft slidably inserted in said nozzle body such that said first member is upwardly and downwardly movable relative to said nozzle body.

13. The component mounting apparatus as claimed in claim 12, wherein said tray transfer nozzle further comprises:

a second member integrally connected to a lower end of said nozzle body; and a spring interposed between said first member and said second member such that said close-contact plate can elastically engage a tray surface.

14. The component mounting apparatus as claimed in claim 11, wherein said tray transfer nozzle comprises:

a fitting shaft which is insertable into a fitting hole formed in an end portion of said pickup head;

an opening/closing claw engageable with said end portion of said pickup head; and a pin projecting from an upper surface of said tray transfer nozzle so as to engage said lower end of said pickup head and position said tray transfer nozzle in a rotational direction relative to a central axis of said pickup head.

15. The component mounting apparatus as claimed in claim 14, wherein said tray transfer nozzle comprises:

a first member supporting said close-contact plate and having an upwardly extending shaft slidably inserted in said nozzle body such that said first member is upwardly and downwardly movable relative to said nozzle body.

16. The component mounting apparatus as claimed in claim 15, wherein said tray transfer nozzle further comprises:

a second member integrally connected to a lower end of said nozzle body; and a spring interposed between said first member and said second member such that said close-contact plate can elastically engage a tray surface.

* * * * *

UNITED STATES PATENT AND TRADEMARK OFFICE
CERTIFICATE OF CORRECTION

PATENT NO. : 5,727,311
DATED : March 17, 1998
INVENTOR(S) : Akiko IDA, et al.

It is certified that error appears in the above-indentified patent and that said Letters Patent is hereby corrected as shown below:

Cover Page, Item [30] Foreign Application Priority Data, the foreign information should read as follows:

--Jan. 17, 1995 [JP] Japan ...........7-004784--

Signed and Sealed this

First Day of September, 1998

Attest:

BRUCE LEHMAN

*Attesting Officer*  *Commissioner of Patents and Trademarks*